(12) United States Patent
Weis

(10) Patent No.: US 6,420,239 B2
(45) Date of Patent: Jul. 16, 2002

(54) MEMORY CELL WITH TRENCH CAPACITOR AND METHOD OF FABRICATING THE MEMORY CELL

(75) Inventor: Rolf Weis, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/871,010

(22) Filed: May 31, 2001

(30) Foreign Application Priority Data

May 31, 2000 (DE) .......................................... 100 27 913

(51) Int. Cl.$^7$ ................. H01L 21/8242; H01L 21/336; H01L 21/20
(52) U.S. Cl. .................. 438/386; 438/243; 438/244; 438/387; 438/257; 438/239
(58) Field of Search ................. 438/386, 387, 438/243, 244, 259, 245, 238, 239, 248, 257

(56) References Cited

U.S. PATENT DOCUMENTS

| | | | | |
|---|---|---|---|---|
| 4,672,410 A | * | 6/1987 | Miura et al. ................ 257/302 |
| 5,177,576 A | | 1/1993 | Kimura et al. |
| 5,183,774 A | * | 2/1993 | Satoh ......................... 438/242 |
| 5,208,657 A | | 5/1993 | Chatterjee et al. |
| 5,376,575 A | * | 12/1994 | Kim et al. .................. 438/239 |
| 5,744,386 A | | 4/1998 | Kenney |
| 5,915,175 A | * | 6/1999 | Wise ........................... 438/238 |
| 6,140,175 A | * | 10/2000 | Kleinhenz et al. .......... 438/243 |
| 6,150,670 A | * | 11/2000 | Faltermeier et al. .......... 257/77 |
| 6,207,494 B1 | * | 3/2001 | Graimann et al. .......... 438/248 |
| 6,225,158 B1 | * | 5/2001 | Furukawa et al. .......... 438/243 |
| 6,245,612 B1 | * | 6/2001 | Chang et al. ................ 438/249 |
| 6,251,722 B1 | * | 6/2001 | Wei et al. .................... 428/243 |
| 6,281,069 B1 | * | 8/2001 | Wu et al. .................... 438/248 |
| 6,291,286 B1 | * | 9/2001 | Hsiao .......................... 438/238 |
| 6,309,924 B1 | * | 10/2001 | Divakaruni et al. ........ 438/243 |

FOREIGN PATENT DOCUMENTS

| | | |
|---|---|---|
| DE | 0852396 A2 * | 7/1998 |
| DE | 0884785 A2 * | 12/1998 |
| DE | 0905771 A2 * | 3/1999 |
| DE | 198 44 997 A1 | 4/2000 |
| EP | 0 738 006 A2 | 10/1996 |
| JP | 207254647 A * | 10/1995 |
| JP | 410256510 A * | 9/1998 |
| JP | 411017151 A * | 1/1999 |
| US | 0302204 A2 * | 2/1989 |

* cited by examiner

*Primary Examiner*—Matthew Smith
*Assistant Examiner*—Chuong A Luu
(74) *Attorney, Agent, or Firm*—Laurence A. Greenberg; Werner H. Stemer; Gregory L. Mayback

(57) ABSTRACT

The memory cell has a trench in which a capacitor is formed. Furthermore, a vertical transistor is formed in the trench, above the trench capacitor. The doping regions of the vertical transistor are arranged in the substrate. In order to connect the gate electrode of the vertical transistor to a word line, a dielectric layer having an inner opening is arranged in the trench, above the gate electrode. The dielectric layer is configured as lateral edge webs which project beyond the cross section of the trench and thus cover part of the substrate. The lateral edge webs enable self-aligned formation of an isolation trench.

5 Claims, 10 Drawing Sheets

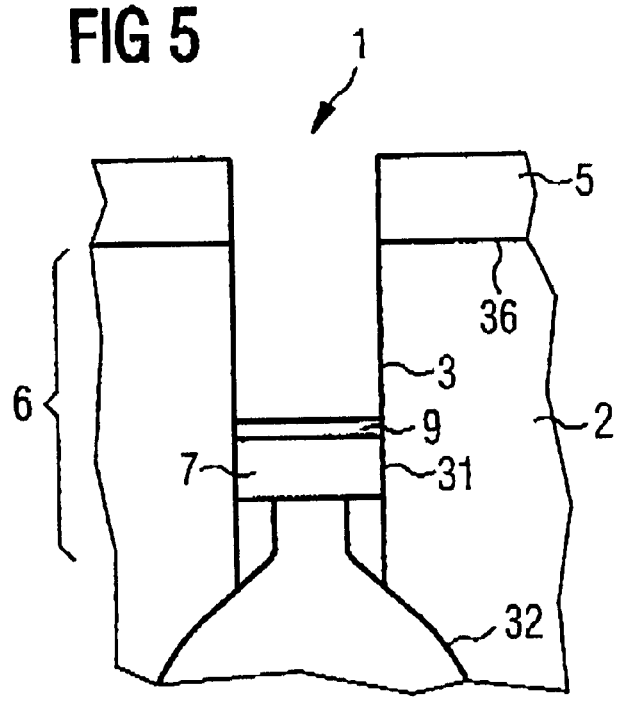
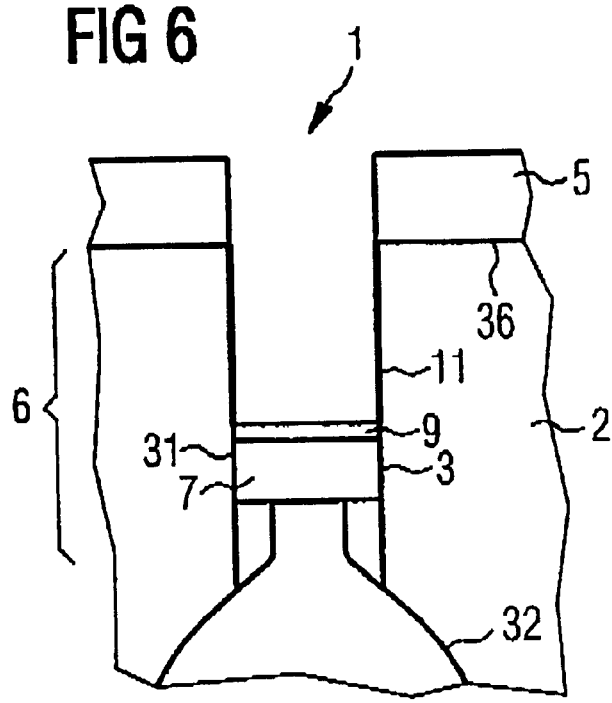

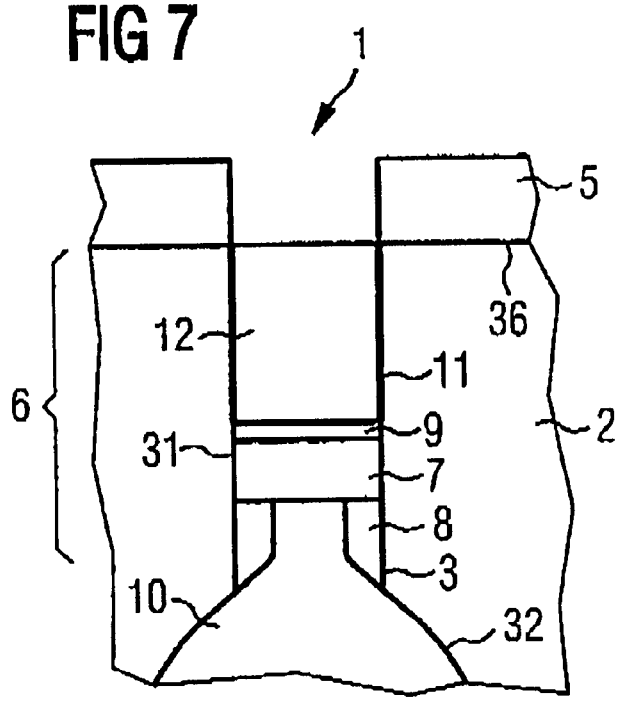
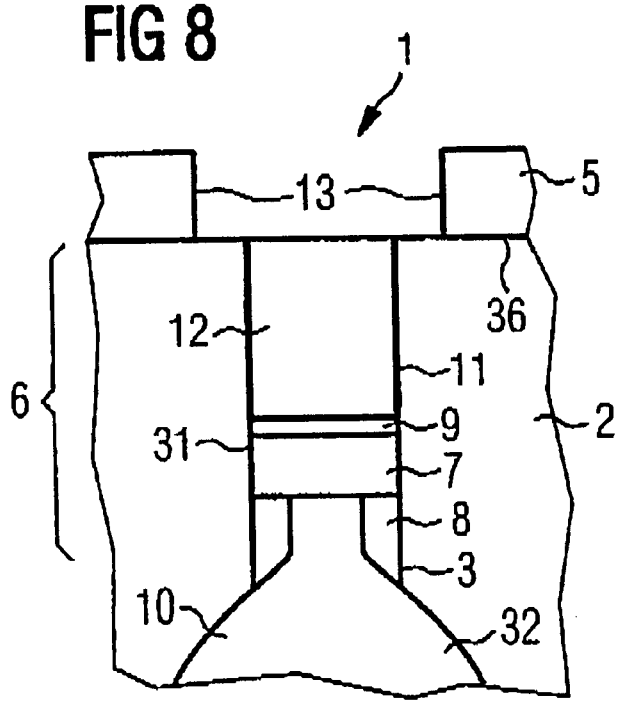

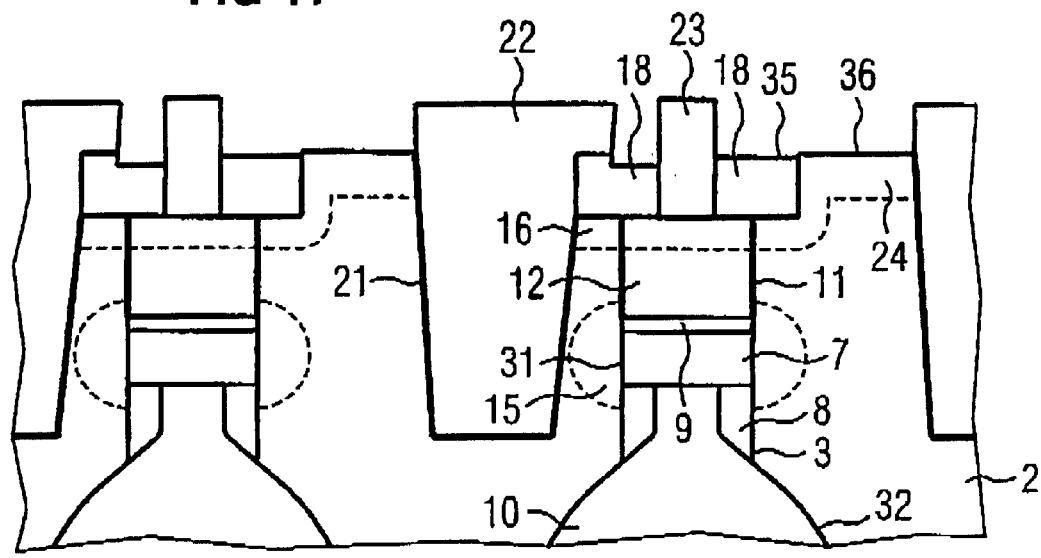
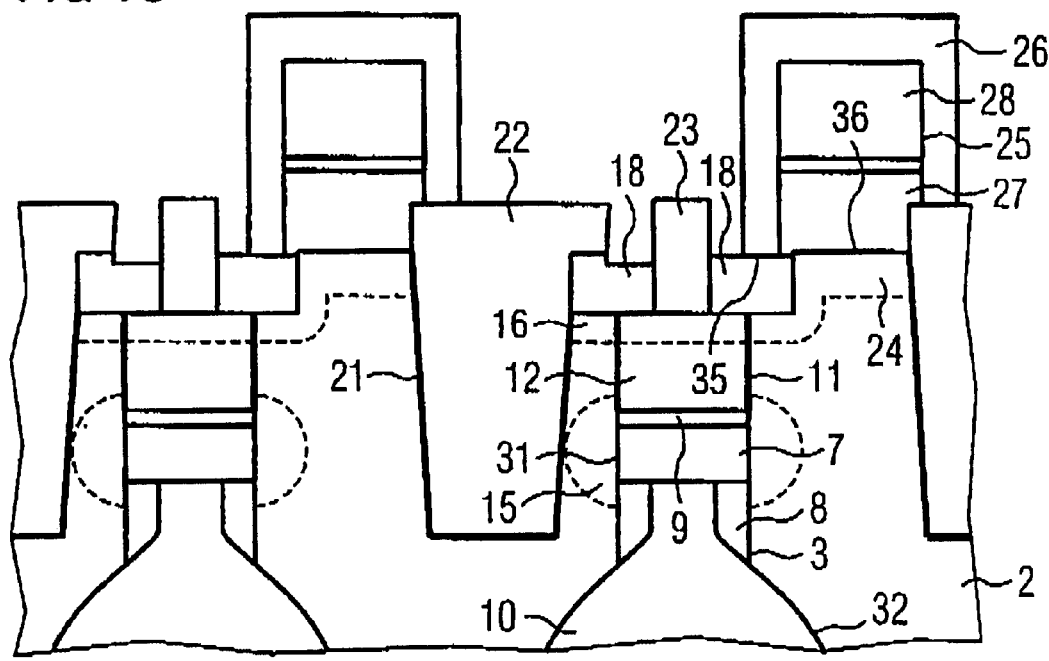

MEMORY CELL WITH TRENCH CAPACITOR AND METHOD OF FABRICATING THE MEMORY CELL

BACKGROUND OF THE INVENTION

Field of the Invention

The present invention relates to a memory cell having a trench capacitor and a method for fabricating it. The trench capacitor is arranged in a substrate and, e.g. in a DRAM (dynamic random access memory), together with a selection transistor may form a DRAM memory cell.

Memory devices such as, for example, DRAMs comprise a cell array and a driving periphery. Individual memory cells are arranged in the cell array.

A DRAM chip contains a matrix of memory cells which are arranged in the form of rows and columns and are driven by word lines and bit lines. The reading of data from the memory cells or the writing of data to the memory cells is realized by the activation of suitable word lines and bit lines.

A DRAM memory cell usually contains a transistor connected to a capacitor. The transistor comprises, inter alia, two diffusion regions which are isolated from one another by a channel controlled by a gate. Depending on the direction of current flow, one diffusion region is designated as the drain region and the other is designated as the source region.

One of the diffusion regions is connected to a bit line, the other is connected to a capacitor and the gate is connected to a word line. Through the application of suitable voltages to the gate, the transistor is controlled in such a way that a current flow between the diffusion regions through the channel is switched on and off.

The progressive miniaturization of memory devices increases the integration level step by step. The increase in the integration level means that the substrate surface available per memory cell decreases more and more.

In order to effectively utilize the available area, it is possible to form the selection transistor as a vertical transistor in a trench above a trench capacitor. A generic memory cell having a trench capacitor and a vertical transistor is described in U.S. Pat. No. 5,177,576. Further embodiments for trench capacitors or transistors are described in U.S. Pat. Nos. 5,208,657 and 5,744,386.

In those embodiments, there is the problem of connecting the gate of the vertical transistor to a word line and of connecting the drain contact of the vertical transistor to a bit line. With progressive miniaturization, the requirements made of these two connections with regard to alignment accuracy will become more stringent. There is an additional problem in the formation of an isolation trench (STI), which should neither be formed too near the trench of the trench capacitor, since the functioning of the vertical transistor arranged in the upper region of the trench is impaired in this case, nor should the isolation trench (STI) be too far removed from the trench of the trench capacitor, since this would waste valuable substrate surface.

SUMMARY OF THE INVENTION

The object of the present invention is to provide a memory cell which overcomes the above-noted deficiencies and disadvantages of the prior art devices and methods of this general kind, and which is improved with regard to its integration capability and which has a trench for use with a transistor. It is a further object of the invention to provide a corresponding fabrication method.

With the above and other objects in view there is provided, in accordance with the invention, a memory cell, comprising:
  a substrate having a trench formed therein with a lower region, an upper region, and a trench opening;
  a trench capacitor formed in the trench;
  a conductive trench filling forming a constituent part of the trench capacitor in the lower region of the trench;
  a vertical selection transistor formed at the upper region of the trench, the vertical selection transistor having a lower doping region disposed in the substrate beside the upper region of the trench, an upper doping region disposed above the lower doping region in the substrate at the upper region of the trench, and a gate electrode; and
  a dielectric layer disposed above the trench and projecting laterally beyond the trench opening, the dielectric layer having an inner opening formed therein extending completely through the dielectric layer.

In other words, a vertical transistor is formed by the lower doping region, arranged laterally beside the trench, the upper doping region and the channel region situated in between. The junction depth (the thickness of the source and drain regions is usually referred to as junction depth in field-effect transistors) of the upper and lower doping regions and the thickness of the channel region are determined e.g. by the distance from an isolation trench. The arrangement of the dielectric layer with its inner opening renders the trench and thus the trench filling uncovered through the inner opening accessible for contact-connections. By way of example, a gate electrode of the vertical transistor may be connected here. By virtue of the invention's arrangement of the dielectric layer projecting beyond the trench opening, the dielectric layer can be used as an etching mask e.g. during the etching of an isolation trench. This procedure has the advantage that the junction depth of the vertical transistor is not defined by a lithography step, but rather can be carried out in a self-aligned manner with respect to the trench with the aid of the dielectric layer.

In accordance with an added feature of the invention, the dielectric layer is recessed into the substrate. Recessing the dielectric layer into the substrate has the advantage that there is a small topology for subsequent layers on the substrate surface. The conformity and uniformity of subsequent layers are thereby improved. In addition, a planar surface is better suited to subsequent photolithographic exposure steps, since the depth of focus in this case only has to encompass a relatively small region.

In accordance with an additional feature of the invention, the dielectric layer has an upper edge and the substrate has a substrate surface and the upper edge of the dielectric layer is arranged at the same level as the substrate surface. The arrangement at the same level avoids a topography step. This configuration can be fabricated e.g. by means of a CMP step (chemical mechanical polishing).

In accordance with an advantageous further feature of the invention, an isolation trench filled with an insulator is arranged beside the dielectric layer. The isolation trench (STI) has the task of insulating adjacent memory cells from one another. It is particularly advantageous here that the dielectric layer can be used as an etching mask for the etching of the isolation trench. This enables self-aligned formation of the isolation trench, the position of the isolation trench being defined not by the lithographic accuracy that can be achieved, but by the position of the dielectric layer.

In accordance with again a further advantageous feature of the invention, a doped region is arranged beside the dielectric layer in the substrate. The doped region beside the dielectric layer is connected to a bit line which runs on the doped region. In addition, the doped region is connected to the upper doping region. This enables a compact arrangement of the memory cells which has an advantageously small connection resistance to the bit line and an advantageously small bit line capacitance.

In accordance with another feature of the invention, a gate electrode is arranged below the dielectric layer. In this case, the gate electrode has the task, for example, of controlling the selection transistor of the memory cell. In this case, the gate electrode is advantageously arranged below the dielectric layer, with the result that it can be connected through the inner opening in the dielectric layer to a word line by means of a word line contact.

With the above and other objects in view there is also provided, in accordance with the invention, a method of fabricating a memory cell, which comprises the following method steps:

etching a trench in the substrate through a first mask formed on the substrate;

forming a trench capacitor in the trench;

forming a vertical selection transistor with a gate electrode in the trench;

widening the first mask and thereby uncovering a widened portion having a larger cross section than a cross section of the trench;

recessing the substrate and the gate electrode, formed in the trench, in the region uncovered by the widened portion, a recess being formed; and forming a dielectric layer in the recess.

In the method according to the invention, the mask which is used for etching the trench for the trench capacitor is widened and used for etching a recess. The widening of the mask has the advantage that a self-aligned process is involved which does not require further photolithographic steps but rather forms a recess in a self-aligned manner around the already existing trench.

In one method step, dopant is introduced into the gate electrode and the substrate into the region of the recess. This process step advantageously forms an upper doping region in the substrate, which can be used as source or drain region of a vertical transistor and can be connected to a bit line.

A further method step provides for a dielectric layer to be deposited in the recess and lateral edge webs to be formed from the dielectric layer by means of an anisotropic etching process. This method step forms the dielectric layer in a self-aligned manner in the recess, the dielectric layer having an inner opening and thus being similar to the form of a torus. This has the advantage that a further lithography step, which would comprise alignment inaccuracies, can be avoided.

A further method step provides for a second mask to be arranged on the substrate and patterned, and for the substrate to be uncovered in a region in which the second mask is patterned. By means of this procedure, the first mask is patterned in a region in which an isolation trench can subsequently be formed. In this case, the removal of the first mask e.g. uncovers a region of the substrate surface and a region of the dielectric layer.

In accordance with a concomitant feature of the invention, the first mask, the second mask and the lateral edge webs form a common etching mask during the etching of an isolation trench. As a result, the isolation trench is etched into the uncovered substrate surface, the alignment accuracy of the photolithography of the second mask not specifying the positioning accuracy of the isolation trench, rather the isolation trench being spaced apart from the trench of the trench capacitor by the dielectric layer in a self-aligned manner, and thus having a distance—which can be set very accurately—from the diffusion regions introduced into the substrate. This enables the junction depth to be set very accurately.

Other features which are considered as characteristic for the invention are set forth in the appended claims.

Although the invention is illustrated and described herein as embodied in a memory cell having a trench capacitor and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3 to 12 are partial sectional views showing the upper region of the trench capacitor from FIG. 1 with respectively successive fabrication steps for forming a memory cell according to the invention;

FIGS. 13 to 19 are partial sectional view of two adjacent memory cells whose fabrication follows that of the memory cell illustrated in FIG. 12, respectively successive fabrication steps being illustrated.

DESCRIPTION OF THE PREFERRED EMBODIMENTS

Figure 2:
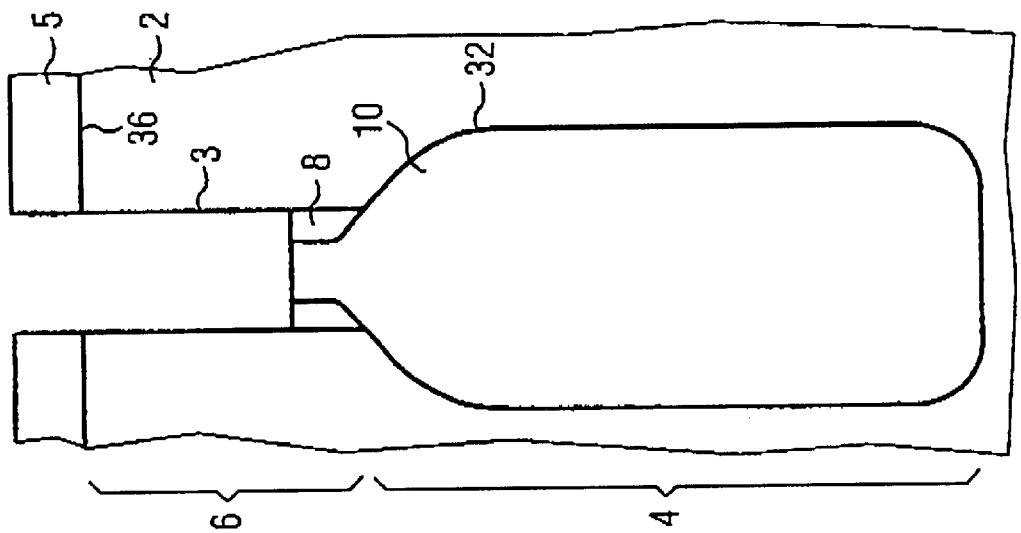
FIG. 2 is a similar view of a trench capacitor which emerges from the trench capacitor illustrated in FIG. 1 as a result of a recessing process.

Identical or functionally equivalent elements are designated with the same reference symbols throughout the drawing figures.

Figure 1:
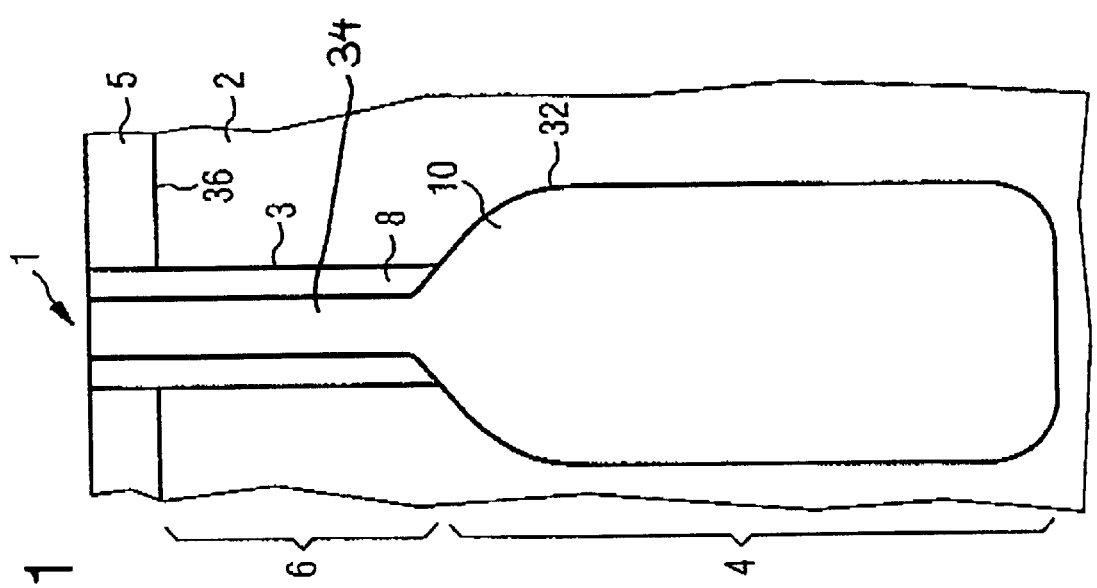
FIG. 1 is a partial sectional view of a trench capacitor which is used as an initial basis for the method according to the invention.

Referring now to the figures of the drawing in detail and first, particularly, to FIG. 1 thereof, there is seen a memory cell 1 comprising a trench 3, which is formed in a substrate 2. In this exemplary embodiment, the substrate 2 is composed of silicon which can be doped with boron, phosphorus or arsenic. The trench 3 has a lower region 4, an upper region 6, and a trench opening 34. An insulation collar 8 is arranged in the upper region 6 of the trench 3. The insulation collar 8 is usually composed of silicon oxide. Furthermore a first mask 5, which serves as an etching mask for the etching of the trench 3, is situated on the substrate 2. The etching mask 5 is formed from silicon nitride, for example. In the lower region 4 of the trench 3, which is bottle-shaped in this case, a capacitor dielectric is arranged on the trench wall. A capacitor dielectric in trench capacitors is usually composed of silicon oxide, silicon nitride or silicon oxynitride or any desired combination of these materials. In addition, the trench 3 is filled with a conductive trench filling 10. The conductive trench filling 10 is composed of doped silicon, for example. The conductive trench filling 10 serves as an inner capacitor electrode, and the exterior substrate 2 serves as an outer capacitor electrode.

A fabrication method for forming the trench capacitor illustrated in FIG. 1 consists in depositing a first mask 5 as a hard mask on a substrate 2, the first mask 5 usually being formed from silicon nitride. By way of example, an LPCVD method (low pressure chemical vapor deposition) is used for fabricating the first mask 5. The first mask 5 is subsequently patterned and used as an etching mask for the etching of the trench 3. After the trench 3 has been etched, it is lined with a capacitor dielectric which can be formed, for example, by thermal oxidation and by CVD methods. In a subsequent method step, the insulation collar 8 is formed in the upper region 6 of the trench 3. The insulation collar 8 is formed from a silicon oxide which is usually applied by means of a CVD process. In this exemplary embodiment, the conductive trench filling 10 is composed of a highly doped polysilicon and is usually likewise deposited into the trench 3 by means of a CVD process.

With reference to FIG. 2, proceeding from FIG. 1, the conductive trench filling 10 and the insulation collar 8 are recessed, with the result that they are removed from the upper region 6 of the trench 3.

Figure 3:
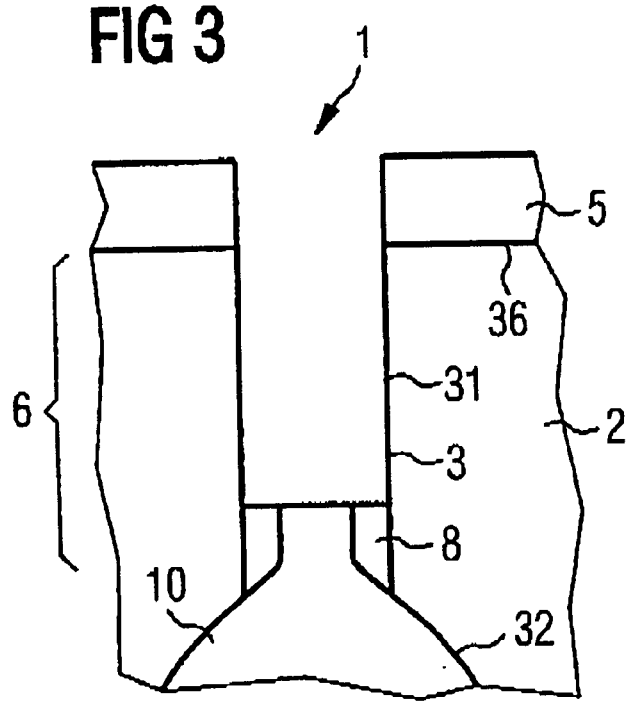

In FIG. 3, the substrate 2 which was uncovered in the upper region 6 of the trench 3 is nitrided. A nitride layer 31 is produced in the process, which layer will later serve as a diffusion barrier for dopant and functions electrically as a tunneling resistance.

Figure 4:
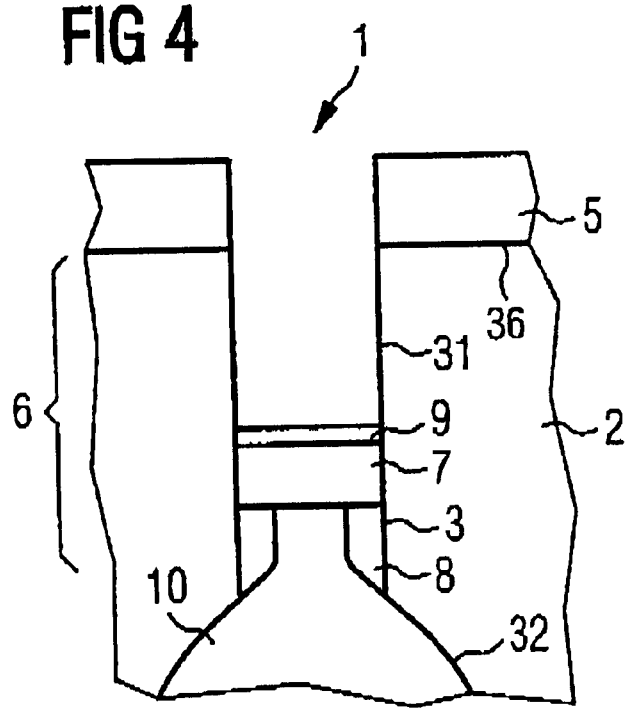

Furthermore (FIG. 4), a conductive layer 7 is formed in the upper region 6 of the trench 3. The conductive layer 7 is composed e.g. of a doped polysilicon which, in a fabrication method, is deposited by means of a CVD process in the trench and planarized and then recessed, thereby attaining the filling level shown in FIG. 4. An insulating covering layer 9 is arranged on the conductive layer 7 in the upper region 6 of the trench 3. The insulating covering layer 9 is composed for example of silicon oxide and can be deposited by means of a CVD process, planarized and recessed into the trench.

With reference to FIG. 5, the nitride layer 31 is removed from the upper region 6 of the trench 3. In this case, the nitride layer 31 is preserved in the region covered by the conductive layer 7 and the insulating covering layer 9. By way of example, the nitride layer 31 can be removed by means of a wet-chemical process using hot phosphoric acid.

In FIG. 6, a gate oxide 11 is formed on the uncovered substrate 2 in the upper region 6 of the trench 3. This can be carried out, for example, in a thermal process step using an oxygen-containing atmosphere.

Afterwards (FIG. 7), a gate electrode 12 is formed in the upper region 6 of the trench 3. This can be carried out for example by means of CVD deposition of doped polysilicon. Afterwards, the deposited polysilicon layer is planarized by means of a CMP step and recessed into the trench 3 as far as the substrate surface.

With reference to FIG. 8, the mask 5 is widened in an etching process, thereby producing the widened portion 13 above the trench 3 and above the substrate 2 in the first mask 5. Since the mask 5 is composed of nitride, for example, the widening can be carried out by means of an etching process using phosphoric acid or HFEG (HF: hydrofluoric acid, EG: ethylene glycol) which etches both silicon oxide and silicon nitride at approximately the same etching rates.

Figure 9:
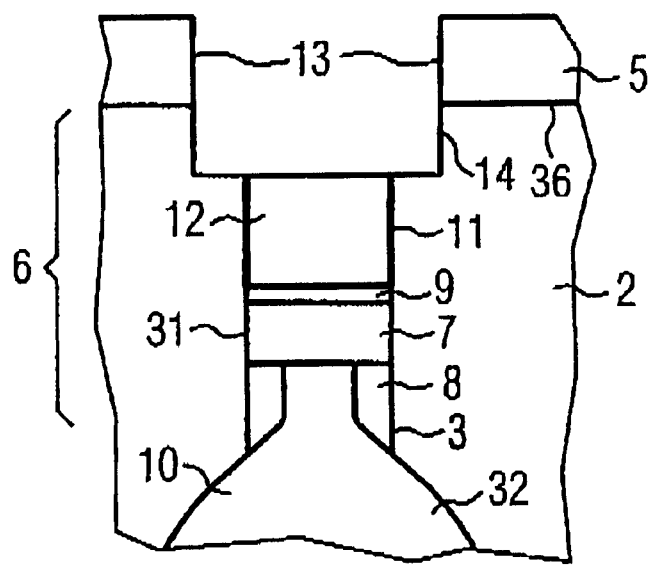

In connection with FIG. 9, a recessing process step is carried out, which transfers the widened portion 13 into the substrate and the trench, the recess 14 being produced. By way of example, the recess 14 can be implemented by means of an anisotropic etching process.

Figure 10:
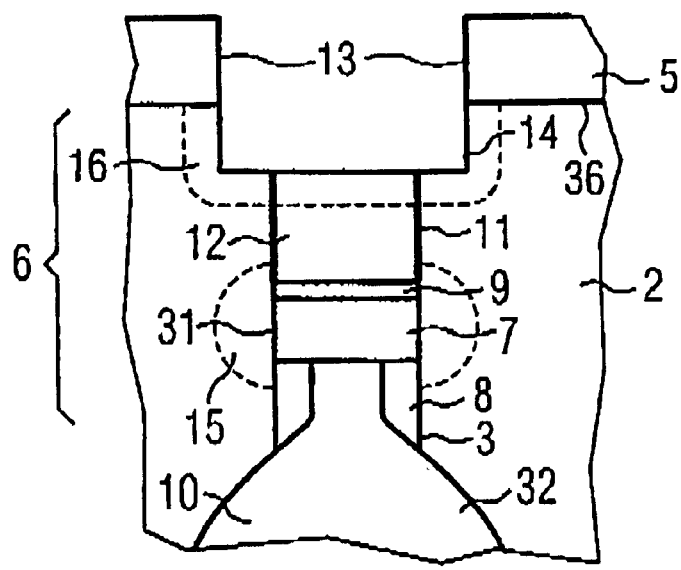

In FIG. 10, a lower doping region 15 and an upper doping region 16 are formed. In this case, the lower doping region 15 is produced by outdiffusion of dopant from the highly doped conductive layer 7. The lower doping region 15 is later used as lower source/drain region of the vertical transistor. The upper doping region 16 is formed for example by means of vapor phase doping. In this case, dopant passes into the substrate 2 and forms the upper doping region 16. During the outdiffusion of the lower doping region 15, which is usually carried out by means of a thermal step, the upper doping region 16 can likewise outdiffuse, in which case possible crystal dislocations resulting from the doping can be annealed. Optionally, the thermal step can be implemented in an oxidizing manner.

Figure 11:
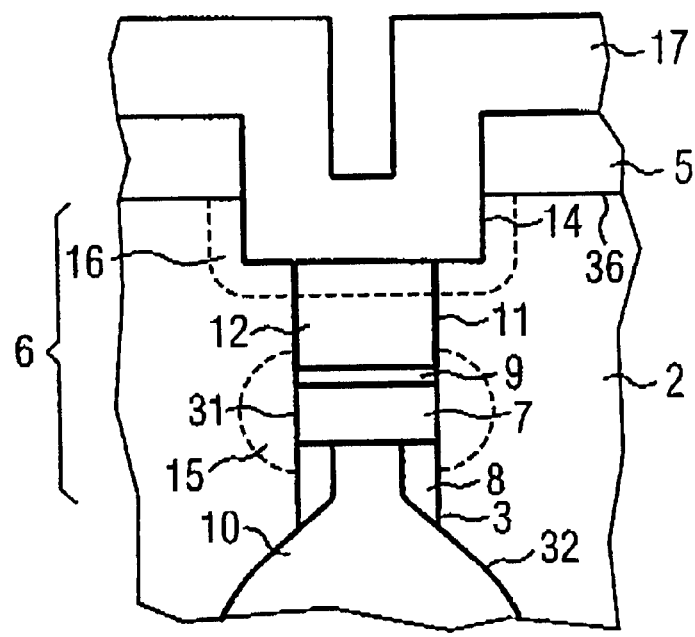

With reference to FIG. 11, a dielectric layer 17 is deposited on the substrate and in the recess 14. The dielectric layer 17 is composed for example of silicon nitride and can be formed by means of a CVD process.

Figure 12:
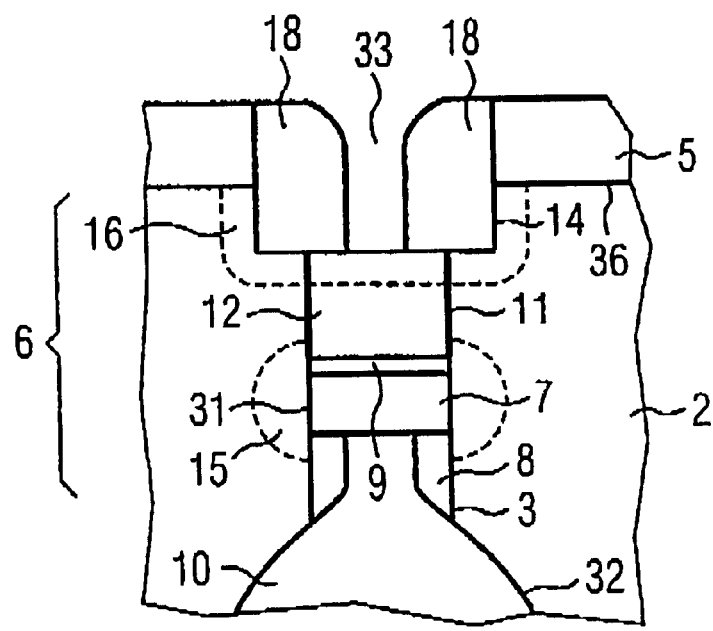

In connection with FIG. 12, an anisotropic etching step is carried out, the lateral edge webs 18 being formed (spacer formation). In this case, the lateral edge webs are arranged in the recess 14 and have an annular structure similar to a torus.

Figure 13:
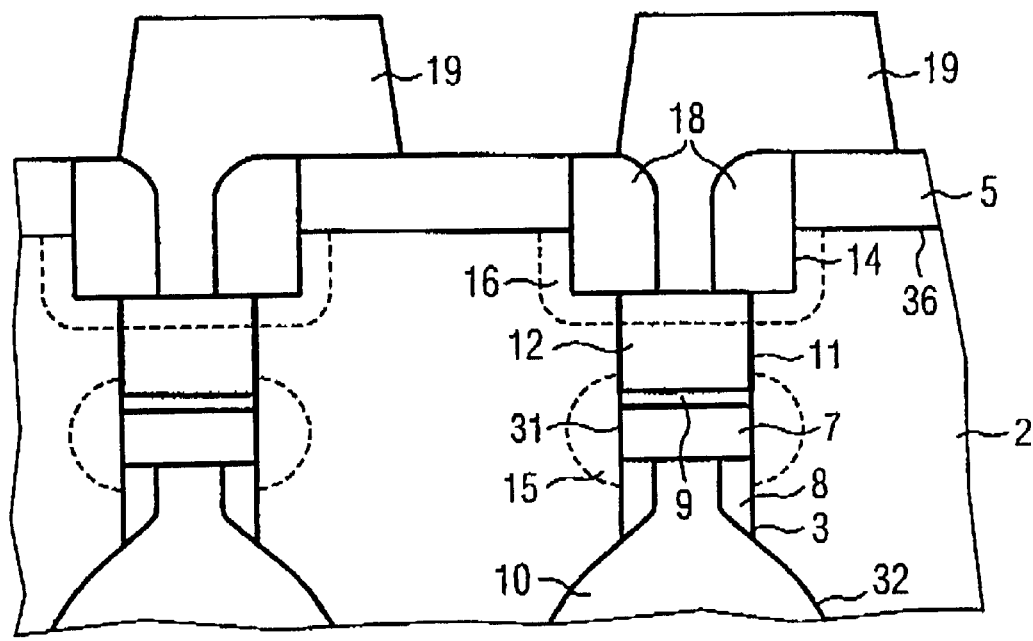

FIG. 13 illustrates two adjacent memory cells. In addition, a second mask 19 has been arranged on the substrate and patterned. The mask 19 is composed for example of a photoresist.

Figure 14:
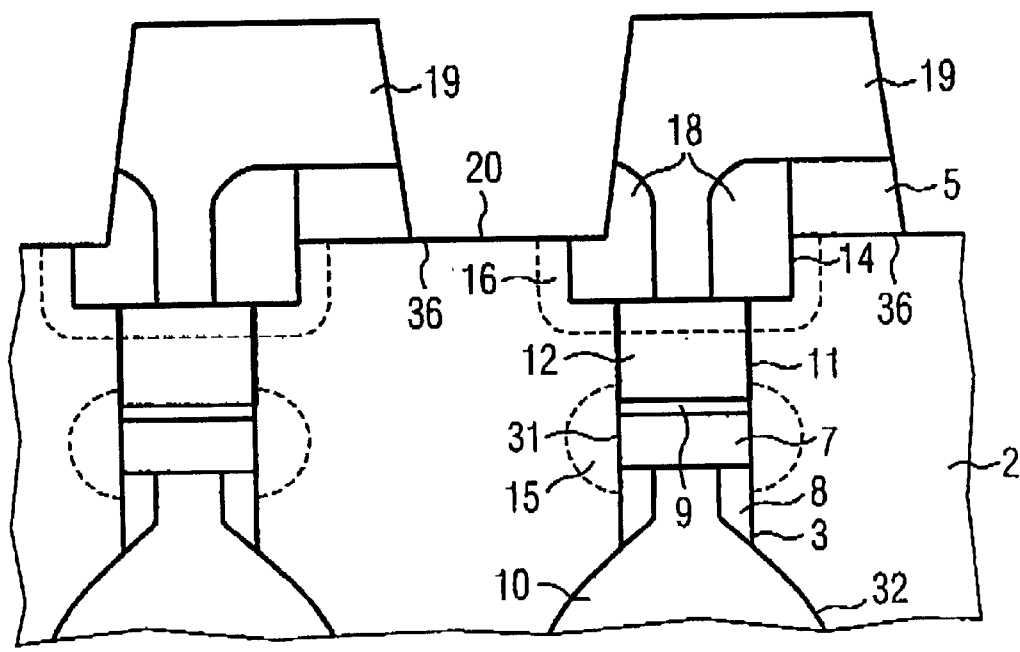

With reference to FIG. 14, the first mask 5 is patterned with the aid of the second mask 19. To that end, an anisotropic etching step, for example, is used. Since the first mask 5 and the lateral edge webs 18 are composed of silicon nitride, both the first mask 5 and the part of the lateral edge web 18 are removed. An uncovered region 20, which releases the substrate surface 36, is produced during this etching process.

Figure 15:
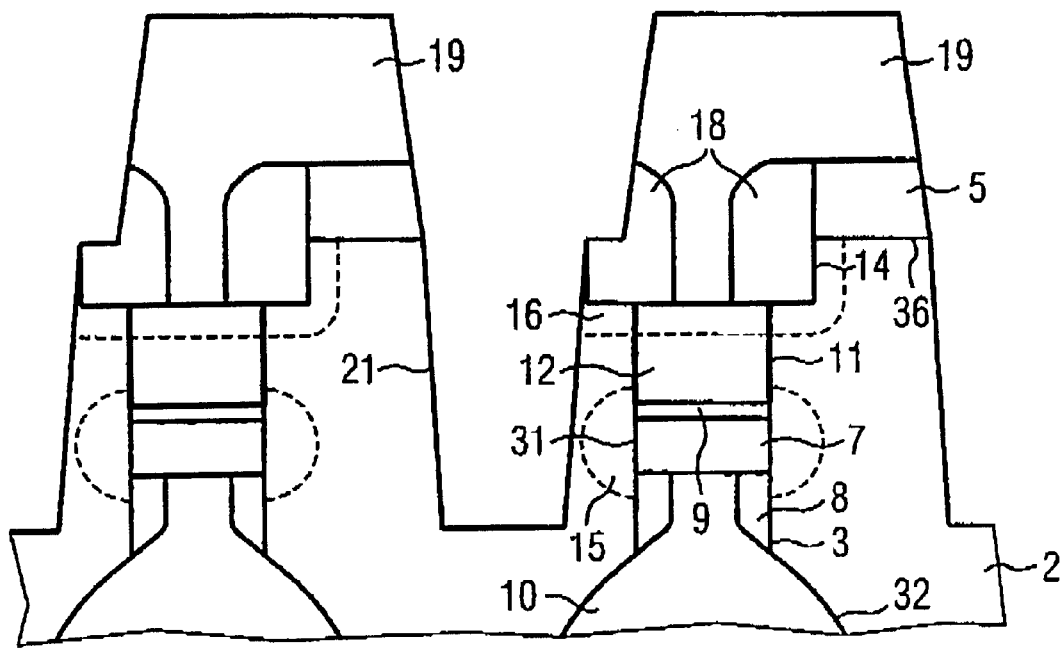

Furthermore (FIG. 15), the isolation trench 21 is etched into the substrate 2 in the uncovered region 20. In this case, the first mask 5, the second mask 19 and the lateral edge web 18 serve as etching mask. The etching can be carried out using substances and processes which etch silicon and at the same time act selectively with respect to silicon nitride and photoresist.

Figure 16:
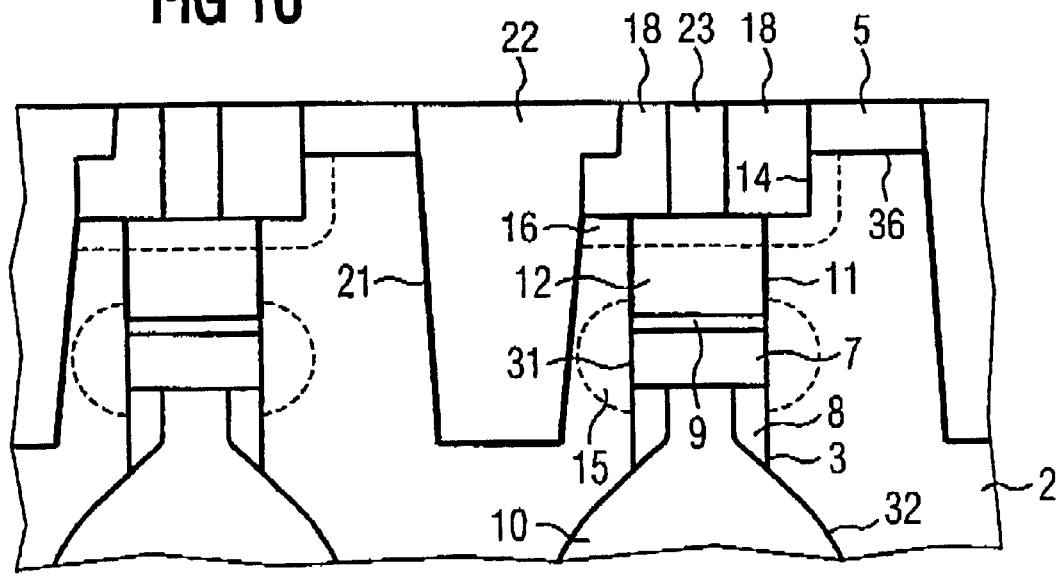

With reference to FIG. 16, the photoresist is removed and afterward the side wall of the isolation trench 21 is oxidized and the isolation trench 21 is filled with an isolation trench filling 22. To that end, an HDP process (high density plasma CVD), for example, may be carried out. During the HDP process, a silicon oxide is filled as isolation trench filling 22 into the isolation trench 21. Afterward, the substrate surface 36 is planarized by means of a CMP process (chemical mechanical polishing).

With reference to FIG. 17, the first mask 5 and a part of the lateral edge webs 18 are removed. Since the first mask 5 and the lateral edge webs 18 are composed of silicon nitride, they can be etched using hot phosphoric acid. The substrate surface 36 is uncovered in the process. Afterward, a screen oxide is arranged on the uncovered substrate surface 36 and a dopant implantation is carried out, the bit line doping region 24 being formed in the substrate 2. Afterward, the screen oxide is removed.

In FIG. 18, a bit line 25 is formed on the bit line doping region 24. In this exemplary embodiment, the bit line 25 comprises a lower bit line layer 27 and an upper bit line layer 28. In this case, the lower bit line layer is composed for example of a highly doped polysilicon; the upper bit line layer 28 is formed for example from tungsten, which has a lower sheet resistance than the doped polysilicon, with the result that the bit line overall is formed with a relatively low impedance. Afterward, an insulation encapsulation 26 is formed around the bit line 25. The insulation encapsulation 26 is composed for example of silicon nitride.

Figure 19:
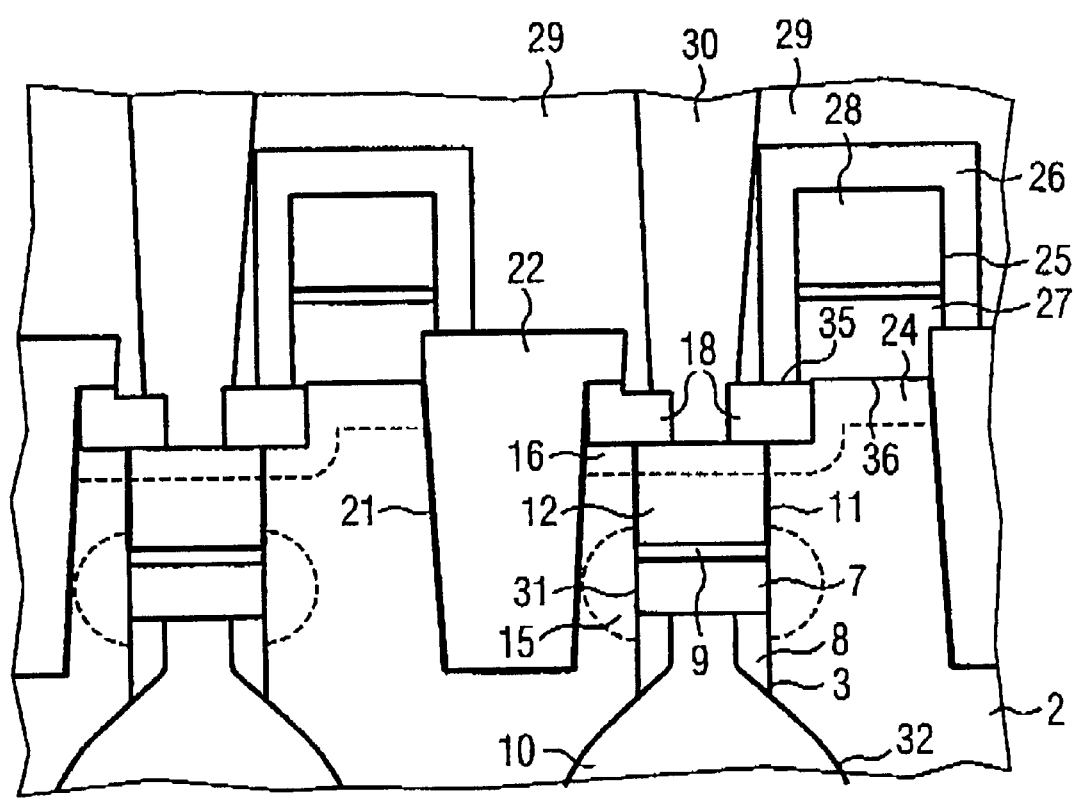

Afterward (FIG. 19), an insulation layer 29 is arranged on the substrate. In this case, the insulation layer 29 covers the bit line 25 and planarizes the surface. The insulation layer 29 is composed for example of a highly doped silicate glass (BPSG) and is made to flow in a thermal step. A trench is etched into the insulation-layer 29, and a word line contact 30 is arranged in said trench. In this case, the word line contact 30 extends from a word line through the insulation layer 29 and through the lateral edge webs 18 as far as the gate electrode 12.

I claim:

1. A method of fabricating a memory cell, which comprises the following method steps:

forming a first mask on a substrate and etching a trench in the substrate;

forming a trench capacitor in the trench;

forming a vertical selection transistor with a gate electrode in the trench;

widening the first mask and thereby uncovering a widened portion having a larger cross section than a cross section of the trench;

recessing the substrate and the gate electrode, formed in the trench, in the region uncovered by the widened portion, a recess being formed; and forming a dielectric layer in the recess.

2. The method according to claim 1, which comprises introducing a dopant into the substrate in the region of the recess and forming an upper doping region.

3. The method according to claim 1, which comprises depositing a dielectric layer in the recess and forming lateral edge webs from the dielectric layer by an anisotropic etching process.

4. The method according to claim 3, which comprises using the first mask, the second mask, and the lateral edge webs as a common etching mask during an etching of an isolation trench.

5. The method according to claim 1, which comprises forming a second mask on the substrate and patterning the second mask, and uncovering the substrate in a region lying between adjacent trench capacitors.

* * * * *